US012777823B2

(12) United States Patent
Lee

(10) Patent No.: US 12,777,823 B2
(45) Date of Patent: Oct. 27, 2026

(54) DISPLAY APPARATUS

(71) Applicant: Samsung Display Co., LTD., Yongin-si (KR)

(72) Inventor: Kyunghee Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 399 days.

(21) Appl. No.: 18/242,052

(22) Filed: Sep. 5, 2023

(65) Prior Publication Data

US 2024/0276853 A1 Aug. 15, 2024

(30) Foreign Application Priority Data

Feb. 7, 2023 (KR) ........................ 10-2023-0016258

(51) Int. Cl.
*H10K 59/80* (2023.01)
*H10K 102/00* (2023.01)

(52) U.S. Cl.
CPC ..... *H10K 59/8792* (2023.02); *H10K 59/8722* (2023.02); *H10K 59/8791* (2023.02); *H10K 2102/351* (2023.02)

(58) Field of Classification Search
CPC ........................ H10K 59/8791; H10K 59/8792
See application file for complete search history.

(56) References Cited

U.S. PATENT DOCUMENTS 8,536,781 B2 9/2013 Do et al.
2014/0077183 A1* 3/2014 Lee ...................... H10K 59/126 257/40
2015/0241736 A1* 8/2015 Yim ..................... H10K 59/871 359/636

(Continued)

FOREIGN PATENT DOCUMENTS

JP 1997318935 12/1997
KR 101076262 B1 10/2011

(Continued)

OTHER PUBLICATIONS

K. Yoshida, et al., "Thin and Low-Reflection Metal Black Matrix for High PPI LCD", ISSN 0097-996X/22/5301-0170-©SID 2022 Digest, https://sid.onlinelibrary.wiley.com/doi/10.1002/jsid.1124; (6 pages).

*Primary Examiner* — Mariceli Santiago
(74) *Attorney, Agent, or Firm* — CANTOR COLBURN LLP

(57) ABSTRACT

A display apparatus includes: a first substrate; a display element disposed over the first substrate and configured to implement an emission area; a first layer including a metal or a metal oxide disposed on the first substrate; a light-blocking layer overlapping the first layer and including a first sub-light-blocking layer, a first inorganic layer, a second sub-light-blocking layer, and a second inorganic layer, where the first inorganic layer is disposed on the first sub-light-blocking layer, the second sub-light-blocking layer is disposed on the first inorganic layer, and the second inorganic layer is disposed on the second sub-light-blocking layer; and a reflection-adjusting layer disposed on the light-blocking layer, where a thickness of the light-blocking layer is equal to or greater than about 100 nm and equal to or less than about 500 nm.

20 Claims, 12 Drawing Sheets

(56) References Cited

U.S. PATENT DOCUMENTS

| | | | | |
|---|---|---|---|---|
| 2015/0243930 | A1* | 8/2015 | Kim | H10K 59/8791 257/40 |
| 2016/0049443 | A1* | 2/2016 | Kim | H10K 71/621 257/91 |
| 2016/0104869 | A1* | 4/2016 | Choi | H10K 59/8792 257/40 |
| 2017/0104182 | A1* | 4/2017 | Kim | H10K 59/38 |
| 2022/0199960 | A1 | 6/2022 | Moon et al. | |
| 2022/0238848 | A1 | 7/2022 | Kwon et al. | |

FOREIGN PATENT DOCUMENTS

| | | | |
|---|---|---|---|
| KR | 20140073216 | A | 6/2014 |
| KR | 20160043227 | A | 4/2016 |
| KR | 101990851 | B1 | 6/2019 |
| KR | 1020200110505 | A | 9/2020 |
| KR | 1020220108287 | A | 8/2022 |

* cited by examiner

FIG. 8A

| (ITEM) | | REFRACTIVE INDEX | REF. REFLECTIVITY RATIO |
|---|---|---|---|
| SiNx | 530 Å | 1.63 | −0.04% |
| | 710 Å | 1.63 | +0.06% |
| | 1240 Å | 1.67 | +0.15% |

FIG. 8B

| (ITEM) | | REFRACTIVE INDEX | REF. REFLECTIVITY RATIO |
|---|---|---|---|
| SiON | 100 Å | 1.59 | −0.18% |
| | 300 Å | 1.59 | −0.42% |
| | 500 Å | 1.59 | −0.39% |
| | 700 Å | 1.59 | −0.13% |
| | 900 Å | 1.59 | +0.23% |

FIG. 8C

| (ITEM) | | REFRACTIVE INDEX | REF. REFLECTIVITY RATIO |
|---|---|---|---|
| SiOx | 1500Å | 1.47 | −0.30% |
| | 1700Å | 1.47 | −0.44% |
| | 1900Å | 1.47 | −0.06% |
| | 2100Å | 1.47 | +0.28% |

DISPLAY APPARATUS

This application claims priority to Korean Patent Application No. 10-2023-0016258, filed on Feb. 7, 2023, and all the benefits accruing therefrom under 35 U.S.C. § 119, the content of which in its entirety is herein incorporated by reference.

BACKGROUND

1. Field

2. Description of the Related Art

One or more embodiments relate to a display apparatus, and more particularly, to a display apparatus with an improved visibility.

SUMMARY

Because an organic light-emitting display apparatus has self-luminous characteristics and, unlike a liquid crystal display apparatus, does not require a separate light source, the thickness and weight of the organic light-emitting display apparatus may be reduced. In addition, the organic light-emitting display apparatus has high-quality characteristics such as low power consumption, high brightness, high response speed, and the like.

Additional aspects will be set forth in part in the description which follows and, in part, will be apparent from the description, or may be learned by practice of the presented embodiments of the disclosure.

According to one or more embodiments, a display apparatus includes: a first substrate; a display element disposed over the first substrate and configured to implement an emission area; a first layer including a metal or a metal oxide disposed on the first substrate; a light-blocking layer overlapping the first layer and including a first sub-light-blocking layer, a first inorganic layer, a second sub-light-blocking layer, and a second inorganic layer, where the first inorganic layer is disposed on the first sub-light-blocking layer, the second sub-light-blocking layer is disposed on the first inorganic layer, and the second inorganic layer is disposed on the second sub-light-blocking layer; and a reflection-adjusting layer disposed on the light-blocking layer, where a thickness of the light-blocking layer is equal to or greater than about 100 nanometers (nm) and equal to or less than about 500 nm.

The reflection-adjusting layer may be in contact with an upper surface of the light-blocking layer.

The light-blocking layer may define an opening therein passing through the first sub-light-blocking layer, the first inorganic layer, the second sub-light-blocking layer, and the second inorganic layer, where the opening corresponds to the emission area in a plan view.

The display apparatus may further include a filling layer disposed on the first layer.

The filling layer may fill the opening passing through the first sub-light-blocking layer, the first inorganic layer, the second sub-light-blocking layer, and the second inorganic layer.

A thickness of the first sub-light-blocking layer may be greater than a thickness of the second sub-light-blocking layer.

A thickness of the first sub-light-blocking layer may be equal to or greater than 100 nm and equal to or less than 200 nm.

A thickness of the second sub-light-blocking layer may be equal to or greater than 8 nm and equal to or less than 11 nm.

Each of the first sub-light-blocking layer and the second sub-light-blocking layer may include metal.

Each of the first sub-light-blocking layer and the second sub-light-blocking layer may include at least one of tungsten (W), molybdenum (Mo), and chromium (Cr).

A refractive index of each of the first inorganic layer and the second inorganic layer may be equal to or greater than about 1.45 and equal to or less than about 1.65.

Each of the first inorganic layer and the second inorganic layer may include at least one of silicon nitride ($SiN_x$), silicon oxynitride (SiON), and silicon oxide ($SiO_x$).

The second inorganic layer may include silicon nitride ($SiN_x$), and a thickness of the second inorganic layer may be equal to or greater than about 50 nm and equal to or less than about 60 nm.

The second inorganic layer may include silicon oxynitride (SiON), and a thickness of the second inorganic layer may be equal to or greater than about 30 nm and equal to or less than about 50 nm.

The second inorganic layer may include silicon oxide ($SiO_x$), and a thickness of the second inorganic layer may be equal to or greater than about 150 nm and equal to or less than about 170 nm.

A thickness of the first inorganic layer may be same as a thickness of the second inorganic layer.

The display apparatus may further include a second substrate disposed on the reflection-adjusting layer.

The display apparatus may further include a sealing member disposed between the first substrate and the second substrate along an outer circumference of the first substrate and the second substrate in a plan view.

The reflection-adjusting layer may include dye, pigment, or a combination thereof.

The first layer may include at least one of ytterbium (Yb), bismuth (Bi), tin (Sn), zinc (Zn), indium (In), molybdenum dioxide ($MoO_2$), molybdenum trioxide ($MoO_3$), tungsten trioxide ($WO_3$), indium tin oxide ("ITO"), and zinc oxide (ZnO).

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 8A to 8C are schematic views showing a reflectivity ratio of incident light to a display apparatus for each thickness according to a material of a second inorganic layer.

DETAILED DESCRIPTION

Figure 1:
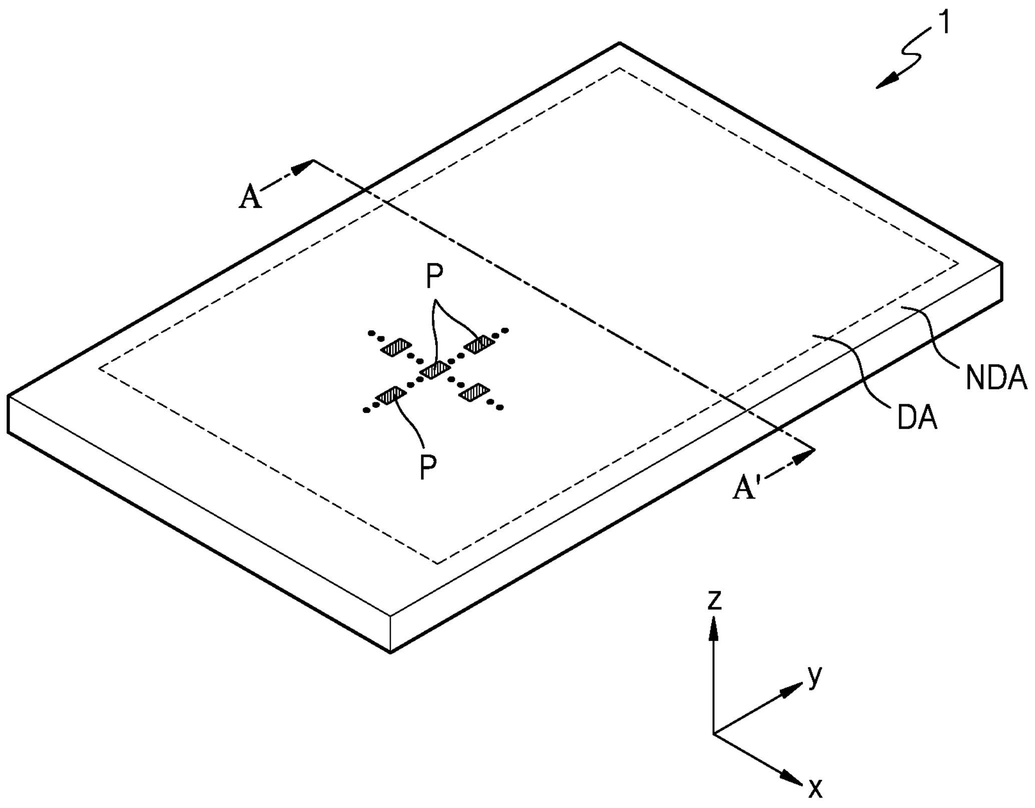
FIG. 1 is a schematic perspective view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that when a layer, region, or element is referred to as being "connected" to another layer, region, or element, it may be "directly connected" to the other layer, region, or element or may be "indirectly connected" to the other layer, region, or element with another layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

FIG. 1 is a schematic perspective view of a display apparatus according to an embodiment.

Referring to FIG. 1, the display apparatus 1 according to an embodiment includes a display area DA and a non-display area NDA outside the display area DA. Although it is shown in FIG. 1 that the display area DA has an approximately rectangular shape, the embodiment is not limited thereto. The display area DA may have various shapes such as circles, ellipses, polygons, and the like.

The display area DA is a portion that displays images, and a plurality of pixels P may be arranged in the display area DA. In the specification, a "pixel" may denote a sub-pixel. Each pixel P may include a light-emitting element such as an organic light-emitting diode OLED. Each pixel P may emit, for example, red, green, blue, or white light.

The display area DA may display preset images by using light emitted from the pixels P. In the present specification, as described above, a pixel P may be defined as an emission area that is configured to emit one of red, green, blue, and white light.

The non-display area NDA is a region in which the pixels P are not arranged and in which no images are displayed. A power supply line, a printed circuit board, or a terminal part may be arranged in the non-display area NDA, the power supply line may drive the pixels P, the printed circuit board may include a driving circuit part, and a driver integrated circuit ("IC") may be connected to the terminal part.

Hereinafter, an organic light-emitting display apparatus is described as an example of the display apparatus 1 according to an embodiment. However, the display apparatus 1 according to an embodiment is not limited thereto. In an embodiment, the display apparatus 1 may be an inorganic light-emitting display apparatus or a quantum-dot light-emitting display apparatus. In an embodiment, for example, an emission layer of a light-emitting element of the display apparatus 1 may include an organic material or an inorganic material. In addition, quantum dots may be arranged on a path of light emitted from the emission layer.

The display apparatus 1 according to an embodiment is applicable to various products including televisions, notebook computers, monitors, advertisement boards, Internet of things ("IoTs") apparatuses as well as portable electronic apparatuses including mobile phones, smartphones, tablet personal computers ("PCs"), mobile communication terminals, electronic organizers, electronic books, portable multimedia players ("PMPs"), navigations, and ultra mobile personal computers ("UMPCs"). In addition, the display apparatus 1 according to an embodiment is applicable to wearable devices including smartwatches, watchphones, glasses-type displays, and head-mounted displays ("HMDs"). In addition, in an embodiment, the display apparatus 1 is applicable to a display screen in instrument panels for automobiles, center fascias for automobiles, or center information displays ("CIDs") arranged on a dashboard, room mirror displays that replace side mirrors of automobiles, and displays of an entertainment system arranged on the backside of front seats for backseat passengers in automobiles.

Figure 2:
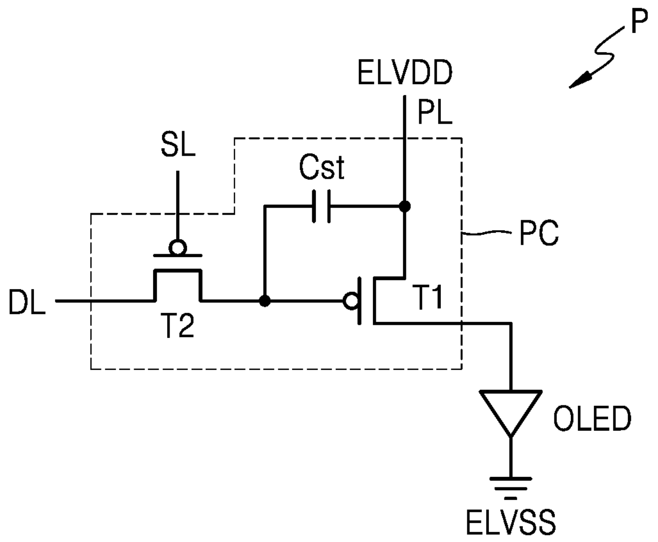
FIG. 2 is a schematic circuit diagram of a display element provided to a pixel of a display apparatus and a pixel circuit connected to the display element according to an embodiment.

FIG. 2 is a schematic circuit diagram of a display element provided to a pixel of the display apparatus 1 and a pixel circuit connected to the display element according to an embodiment.

Referring to FIG. 2, an organic light-emitting diode OLED, which is the display element, is connected to a pixel circuit PC. The pixel circuit PC may include a first thin-film transistor T1, a second thin-film transistor T2, and a storage capacitor Cst. The organic light-emitting diode OLED may be configured to emit, for example, red, green, or blue light, or emit red, green, blue, or white light.

The second thin-film transistor T2 is a switching thin-film transistor, may be connected to a scan line SL and a data line DL, and configured to transfer a data voltage to the first thin-film transistor T1 according to a switching voltage, the data voltage may be input from the data line DL, and the switching voltage may be input from the scan line SL. The storage capacitor Cst may be connected to the second thin-film transistor T2 and a driving voltage line PL and configured to store a voltage corresponding to a difference between a voltage transferred from the second thin-film transistor T2 and a first power voltage ELVDD supplied to the driving voltage line PL.

The first thin-film transistor T1 is a driving thin-film transistor, may be connected to the driving voltage line PL and the storage capacitor Cst, and configured to control a driving current according to the voltage stored in the storage capacitor Cst, the driving current flowing from the driving voltage line PL to the organic light-emitting diode OLED. The organic light-emitting diode OLED may be configured to emit light having a preset brightness corresponding to the driving current. An opposite electrode (e.g., a cathode) of the organic light-emitting diode OLED may receive a second power voltage ELVSS.

Although it is shown in FIG. 2 that the pixel circuit PC includes two thin-film transistors and one storage capacitor, the number of thin-film transistors or the number of storage capacitors may be variously changed depending on the design of the pixel circuit PC.

Figure 3:
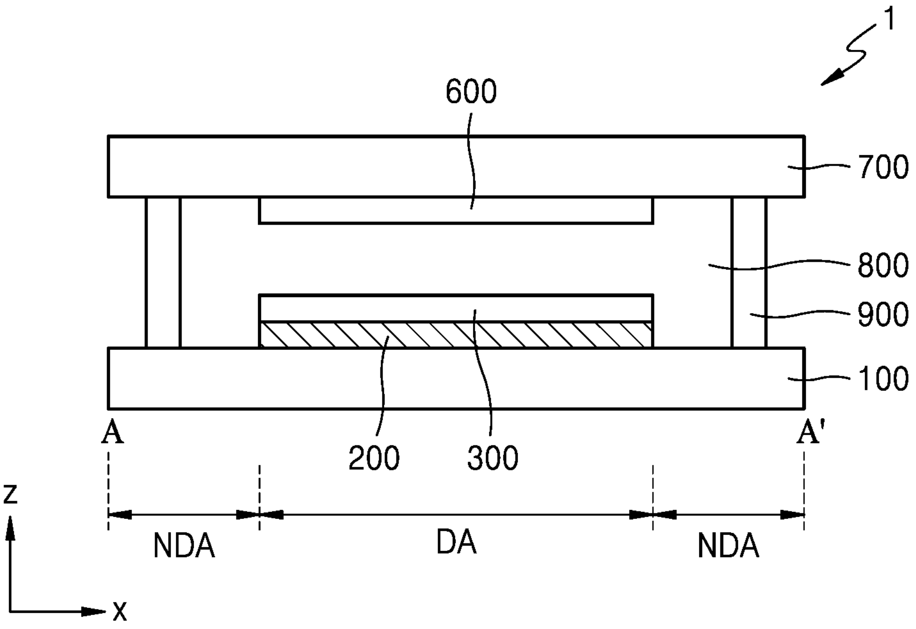
FIG. 3 is a schematic cross-sectional view of a display apparatus according to an embodiment.

FIG. 3 is a schematic cross-sectional view of the display apparatus 1 according to an embodiment. FIG. 3 is a cross-sectional view of the display apparatus 1 of FIG. 1, taken along line A-A' shown in FIG. 1.

Referring to FIG. 3, the display apparatus 1 according to an embodiment may include a substrate 100 (e.g., a first substrate), a display layer 200, a first layer 300, an anti-reflection layer 600, a second substrate 700 (e.g., an encapsulation substrate), and a sealing member 900, where the first layer 300 includes metal or metal oxide.

The first substrate 100 may include glass or polymer resin. In an embodiment, for example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The first substrate 100 including the polymer resin may be flexible, rollable, or bendable. The first substrate 100 may have a multi-layered structure including a layer that includes polymer resin and an inorganic layer (not shown).

The display layer 200 may include an organic light-emitting diode, a pixel circuit, and insulating layers therebetween, where the organic light-emitting diode is a display element, and the pixel circuit is electrically connected to the organic light-emitting diode. In addition, the display layer 200 may include scan lines, data lines, power lines connected to the pixel circuit, and a scan driver, data lines, and fan-out lines, where the scan driver is configured to apply scan signals to the scan lines, and the fan-out lines connect the data lines to a display driver. The first layer 300 may be disposed on the display layer 200, where the first layer 300 includes metal or metal oxide.

The second substrate 700 (the encapsulation substrate) may be disposed over the first substrate 100. The second substrate 700 (the encapsulation substrate) may include glass or polymer resin. In an embodiment, for example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The second substrate 700 including the polymer resin may be flexible, rollable, or bendable. The second substrate 700 (the encapsulation substrate) may have a multi-layered structure including a layer that includes polymer resin and an inorganic layer (not shown).

The anti-reflection layer 600 may be directly disposed on a lower surface of the second substrate 700 (e.g., the encapsulation substrate) facing the first substrate 100. When the anti-reflection layer 600 is directly disposed on the lower surface of the second substrate 700 (e.g., the encapsulation substrate), it may mean that the anti-reflection layer 600 is directly formed on the second substrate 700 (e.g., the encapsulation substrate), and then the first substrate 100 is bonded to the second substrate 700 (e.g., the encapsulation substrate) such that the anti-reflection layer 600 is disposed between the first substrate 100 and the second substrate 700 (e.g., the encapsulation substrate).

The first substrate 100 and the second substrate 700 (the encapsulation substrate) may be connected to each other through the sealing member 900. The sealing member 900 may be arranged in the non-display area NDA to surround the display area DA. In an embodiment, for example, the sealing member 900 may be arranged in the outer circumference of the display area DA in a plan view and may form a closed loop. In this case, the sealing member 900 may be configured to completely block the display area DA from the outside. The sealing member 900 may include sealant, frit, or the like.

A filling layer 800 may be disposed between the first substrate 100 and the second substrate 700 (the encapsulation substrate).

Figure 4A:
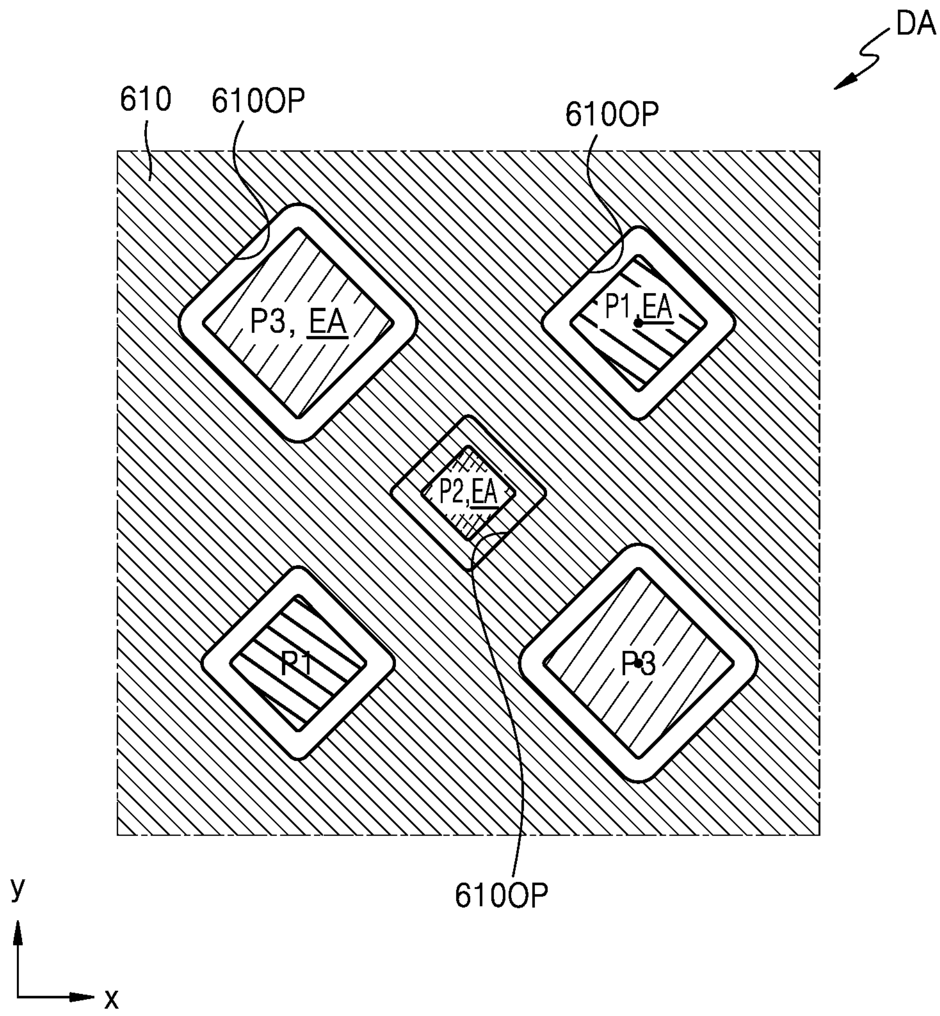
FIGS. 4A and 4B are schematic plan views of a pixel configuration of a display apparatus according to an embodiment.
Figure 4B:
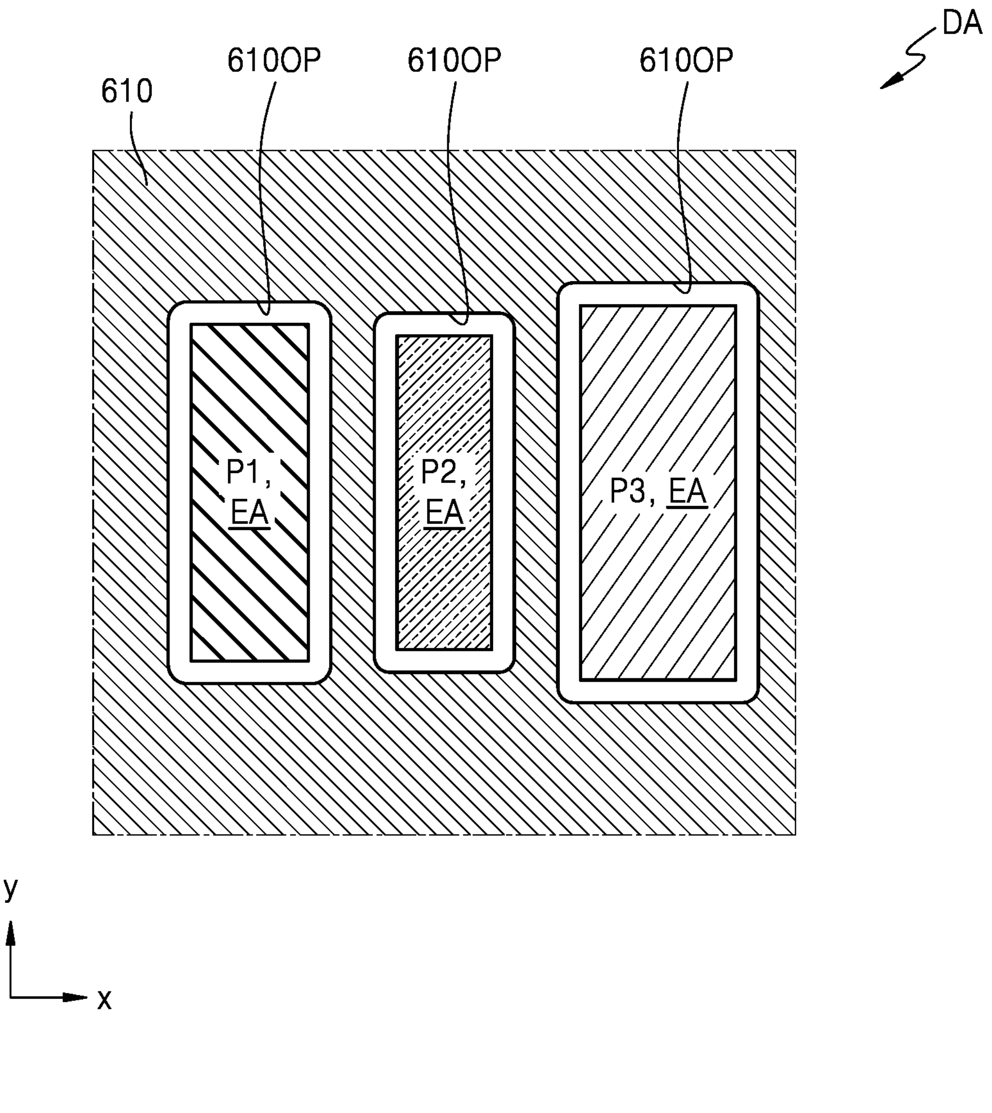

FIGS. 4A and 4B are schematic plan views of a pixel configuration of the display apparatus 1 according to an embodiment. As used herein, the "plan view" is a view in a thickness direction (i.e., z direction) of the light-blocking layer.

Referring to FIG. 4A, the display apparatus 1 may include a plurality of pixels arranged in the display area DA, and the plurality of pixels may include a first pixel P1, a second pixel P2, and a third pixel P3 configured to emit light of different colors, respectively. In an embodiment, for example, the first pixel P1 may be configured to emit red light, the second pixel P2 may be configured to emit green light, and the third pixel P3 may be configured to emit blue light. However, the embodiment is not limited thereto. In another embodiment, for example, the first pixel P1 may be configured to emit blue light, the second pixel P2 may be configured to emit green light, and the third pixel P3 may be configured to emit red light. However, various modifications may be made.

The first pixel P1, the second pixel P2, and the third pixel P3 may each have a polygonal shape in a plan view. As an example, although it is shown in FIG. 4A that the first pixel P1, the second pixel P2, and the third pixel P3 each have a quadrangular shape having round edges, the embodiment is not limited thereto. In another embodiment, the first pixel P1, the second pixel P2, and the third pixel P3 may each have a circular shape or an elliptical shape.

The sizes of the first pixel P1, the second pixel P2, and the third pixel P3 may be different from one another. In an embodiment, for example, the area of the second pixel P2 may be less than the area of the first pixel P1 and the third pixel P3. The area of the first pixel P1 may be greater than the area of the third pixel P3. In another embodiment, the sizes of the first pixel P1, the second pixel P2, and the third pixel P3 may be substantially the same. However, various modifications may be made.

Figure 5:
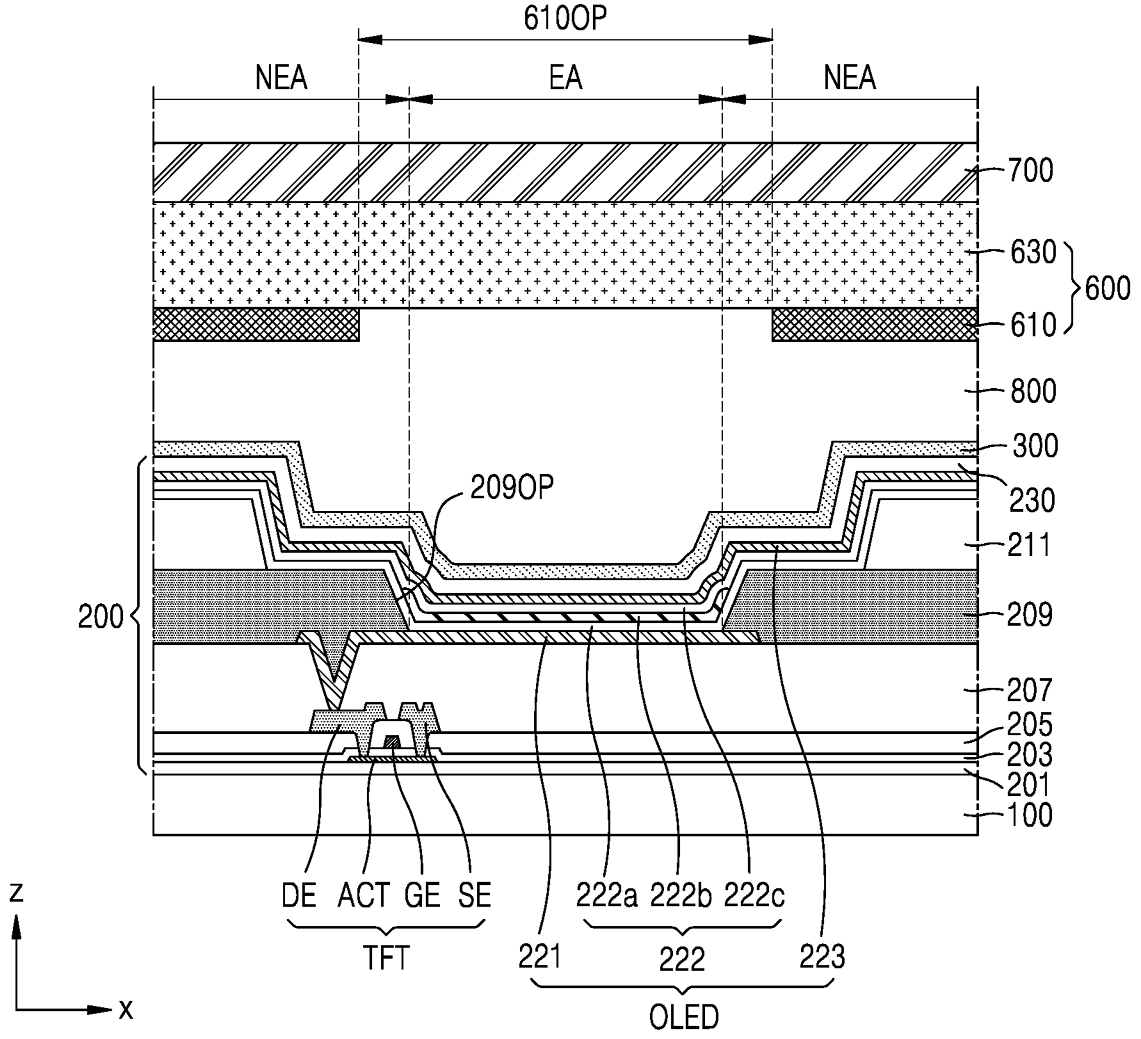
FIG. 5 is a schematic cross-sectional view of a display apparatus according to an embodiment.

In the present specification, each of the sizes of the first pixel P1, the second pixel P2, and the third pixel P3 denotes the size of an emission area EA of the display element configured to implement each pixel, and the emission area EA may be defined by an opening 2090P (see FIG. 5) of a pixel-defining layer 209 (see FIG. 5).

A light-blocking layer 610 disposed on a display element layer defines an opening 610OP therein corresponding to each pixel. The opening 610OP is a region formed by removing a portion of the light-blocking layer 610. Light emitted from the display element may be emitted to the outside through the opening 610OP. A body portion of the light-blocking layer 610 may include a material configured to reflect or cancel external light, and accordingly, visibility of the display apparatus 1 may be effectively improved.

In a plan view, the opening 610OP of the light-blocking layer 610 may be arranged to surround each of the first pixel P1, the second pixel P2, and the third pixel P3. In an embodiment, the opening 610OP of the light-blocking layer 610 may be provided in a quadrangular shape having round edges. An area of the opening 610OP of the light-blocking layer 610 corresponding to each of the first pixel P1, the second pixel P2, and the third pixel P3 may be greater than the area of each of the first pixel P1, the second pixel P2, and the third pixel P3. However, the embodiment is not limited thereto. In another embodiment, the area of the opening 610OP of the light-blocking layer 610 may be provided to be substantially same as the area of the first pixel P1, the second pixel P2, or the third pixel P3 corresponding thereto.

As shown in FIG. 4A, the first pixel P1, the second pixel P2, and the third pixel P3 may be arranged in a pixel configuration of a PENTILE structure. However, the embodiment is not limited thereto. In another embodiment, for example, as shown in FIG. 4B, the pixels may be arranged in a stripe structure. In addition, in another embodiment, the first pixel P1, the second pixel P2, and the third pixel P3 may be arranged in various pixel configuration structures such as a mosaic structure, a delta structure, and the like.

FIG. 5 is a schematic cross-sectional view of the display apparatus 1 according to an embodiment.

Referring to FIG. 5, in an embodiment, the display apparatus 1 may include the first substrate 100, the display layer 200, the first layer 300, the filling layer 800, the anti-reflection layer 600, and the second substrate 700 (e.g., the encapsulation substrate) as described with reference to FIG. 3, where the first layer 300 includes metal or metal oxide.

The display layer 200 may include an organic light-emitting diode OLED and a thin-film transistor TFT, and include a buffer layer 201, a gate insulating layer 203, an interlayer-insulating layer 205, a planarization layer 207, the pixel-defining layer 209, and a spacer 211.

The buffer layer 201 may be disposed on the first substrate 100. The buffer layer 201 may reduce or block penetration of foreign materials, moisture, or external air from below the first substrate 100. In addition, the buffer layer 201 may provide a flat surface on the upper surface of the first substrate 100. The buffer layer 201 may include silicon oxide ($SiO_2$) or silicon nitride ($SiN_x$). In an embodiment, a barrier layer (not shown) may be disposed between the first substrate 100 and the buffer layer 201, where the barrier layer blocks penetration of external air. The barrier layer (not shown) may include an inorganic insulating material.

The thin-film transistor TFT may be disposed on the buffer layer 201. The thin-film transistor TFT may correspond to the first thin-film transistor T1 (see FIG. 2) shown in FIG. 2. The thin-film transistor TFT may include a semiconductor layer ACT, a gate electrode GE, a source electrode SE, and a drain electrode DE. The source electrode SE or the drain electrode DE of the thin-film transistor TFT may be electrically connected to a pixel electrode 221 of the organic light-emitting diode OLED to drive the pixel electrode 221.

The semiconductor layer ACT may be disposed on the buffer layer 201 and may include polycrystalline silicon. Alternatively, the semiconductor layer ACT may include amorphous silicon. Alternatively, the semiconductor layer ACT may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer ACT may include a channel region, a source region, and a drain region, where the source region and the drain region are doped with impurities.

The gate electrode GE, the source electrode SE, and the drain electrode DE may each include various conductive materials. The gate electrode GE may include at least one of molybdenum, aluminum, copper, and titanium. In an embodiment, for example, the gate electrode GE may include a single Mo layer or have a three-layered structure of a Mo layer, an Al layer, and a Mo layer. The source electrode SE and the drain electrode DE may include at least one of copper, titanium, and aluminum. In an embodiment, for example, the source electrode SE and the drain electrode DE may each include a three-layered structure of a Ti layer, an Al layer, and a Ti layer. In an embodiment, the source electrode SE or the drain electrode DE may be omitted, and a source region or a drain region of the semiconductor layer ACT may serve as a source electrode or a drain electrode.

To secure insulation between the semiconductor layer ACT and the gate electrode GE, the gate insulating layer 203 may be disposed between the semiconductor layer ACT and the gate electrode GE, where the gate insulating layer 203 includes an inorganic material such as silicon oxide, silicon nitride, and/or silicon oxynitride. Together, the interlayer-insulating layer 205 may be disposed on the gate electrode GE, where the interlayer-insulating layer 205 includes an inorganic material such as silicon oxide, silicon nitride, and/or silicon oxynitride. The source electrode SE and the drain electrode DE may be disposed on the interlayer-insulating layer 205. The insulating layer including the inorganic material may be formed by chemical vapor deposition ("CVD") or atomic layer deposition ("ALD").

The planarization layer 207 may be disposed on the thin-film transistor TFT. In an embodiment, after the planarization layer 207 is formed, a flat upper surface may be provided by performing chemical and/or mechanical polishing on the upper surface of the planarization layer 207. The planarization layer 207 may include a general-purpose polymer such as photosensitive polyimide, polyimide, polycarbonate ("PC"), benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. Although it is shown in FIG. 5 that the planarization layer 207 is a single layer, the planarization layer 207 may include a multi-layer in another embodiment.

The organic light-emitting diode OLED may be disposed on the planarization layer 207. The organic light-emitting diode OLED may include the pixel electrode 221, an intermediate layer 222, and an opposite electrode 223.

The pixel electrode 221 may be disposed on the planarization layer 207. Pixel electrodes 221 may be apart from each other to correspond to pixels, respectively.

The pixel electrode 221 may be a reflective electrode. In an embodiment, for example, the pixel electrode 221 may include a reflective layer and a transparent or semi-transparent conductive layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent conductive layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, for example, the pixel electrode 221 may have a stack structure of ITO/Ag/ITO.

The pixel-defining layer 209 may be disposed on the pixel electrode 221. The pixel-defining layer 209 may define the opening 2090P therein exposing the central portion of the pixel electrode 221. The pixel-defining layer 209 may cover the edges of the pixel electrode 221 and prevent arcs and the like from occurring at the edges of the pixel electrode 221 by increasing a distance between the edges of the pixel electrode 221 and the opposite electrode 223. The emission area EA may be defined by the opening 2090P.

The pixel-defining layer 209 may include an organic insulating material. Alternatively, the pixel-defining layer 209 may include an inorganic insulating material such as silicon nitride, silicon oxynitride, or silicon oxide. Alternatively, the pixel-defining layer 209 may include an organic insulating material and an inorganic insulating material.

In an embodiment, the pixel-defining layer 209 may include a light-blocking material and be provided in black. The light-blocking material may include carbon black, carbon nanotubes, resin or paste including black dye, metal particles, for example, nickel, aluminum, molybdenum, and an alloy thereof, metal oxide particles (e.g., chrome oxide) or metal nitride particles (e.g., chrome nitride). In the case where the pixel-defining layer 209 includes a light-blocking material, external light reflection by a metal structure disposed below the pixel-defining layer 209 may be reduced. However, the embodiment is not limited thereto. In another embodiment, the pixel-defining layer 209 may not include the light-blocking material but may include a light-transmissive organic insulating material.

The spacer 211 may be disposed on the pixel-defining layer 209. The spacer 211 may include an organic insulating material such as polyimide. Alternatively, the spacer 211 may include an inorganic insulating material such as silicon nitride ($SiN_x$) or silicon oxide ($SiO_2$), or include an organic insulating material and an inorganic insulating material.

In an embodiment, the spacer 211 may include the same material as the material of the pixel-defining layer 209. In this case, the pixel-defining layer 209 and the spacer 211 may be formed together during a mask process that uses a half-tone mask and the like. In another embodiment, the spacer 211 may include a different material from a material of the pixel-defining layer 209.

The intermediate layer 222 may be disposed on the pixel electrode 221 and the pixel-defining layer 209. The intermediate layer 222 may include a first common layer **222*a*, an emission layer 222*b*, and a second common layer 222*c***.

The emission layer **222*b* may be disposed in the opening 2090P of the pixel-defining layer 209 to correspond to the pixel electrode 221. The emission layer 222*b* may include an organic material including a fluorescent or phosphorous material that may emit blue, green, or red light. The organic material may include a low molecular weight organic material or a polymer organic material. Alternatively, the emission layer 222*b*** may be an inorganic material including quantum dots. Specifically, a quantum dot denotes a crystal of a semiconductor compound and may include an arbitrary material that may emit light in various light emission wavelengths depending on the size of the crystal. The quantum dot may include, for example, one of a Group III-V semiconductor compound, a Group II-VI semiconductor compound, a Group III-V semiconductor compound, a Group I-III-VI semiconductor compound, a Group IV-VI semiconductor compound, a Group IV element or compound, or an arbitrary combination thereof.

The first common layer **222*a* and the second common layer 222*c* may be disposed under and on the emission layer 222*b*, respectively. The first common layer 222*a* may include, for example, a hole transport layer ("HTL"), or include an HTL and a hole injection layer ("HIL"). The second common layer 222*c* may include, for example, an electron transport layer ("ETL"), or include an ETL and an electron injection layer ("EIL"). In an embodiment, the second common layer 222*c*** may be omitted.

While the emission layer **222*b* is patterned and formed to correspond to the opening 2090P of the pixel-defining layer 209, the first common layer 222*a* and the second common layer 222*c* may each be integrally formed to cover the first substrate 100 entirely. In other words, the first common layer 222*a* and the second common layer 222*c* may each be integrally formed to entirely cover the pixels P (see FIG. 1) arranged in the display area DA (see FIG. 1**).

The opposite electrode 223 may be disposed on the intermediate layer 222. The opposite electrode 223 may include a conductive material having a low work function. In an embodiment, for example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), ytterbium (Yb), or an alloy thereof. In an embodiment, for example, the opposite electrode 223 may include AgMg or AgYb. Alternatively, the opposite electrode 223 may further include a layer on the (semi) transparent layer, the layer including ITO, IZO, ZnO, or $In_2O_3$. Layers from the pixel electrode 221 to the opposite electrode 223 may constitute the organic light-emitting diode OLED.

In an embodiment, the display apparatus 1 may further include a capping layer 230 disposed on the organic light-emitting diode OLED. The capping layer 230 may be configured to improve the light-emission efficiency of the organic light-emitting diode OLED based on the constructive interference principle. The capping layer 230 may include a material having a refractive index of equal to or greater than about 1.6 with respect to light of, for example, about 589 nanometers (nm). However, the embodiment is not limited thereto. The display apparatus 1 may not include the capping layer 230 in another embodiment.

The capping layer 230 may be an organic capping layer including an organic material, an inorganic capping layer including an inorganic material, or a composite capping layer including an organic material and an inorganic material. In an embodiment, for example, the capping layer 230 is a carbocyclic compound, a heterocyclic compound, an amine group-containing compound, porphine derivatives, phthalocyanine derivatives, naphthalocyanine derivatives, alkali metal complexes, alkali earth metal complexes, or an arbitrary combination thereof. Carbocyclic compounds, heterocyclic compounds, and amine group-containing compounds may optionally be substituted with substituents including O, N, S, Se, Si, F, Cl, Br, I, or an arbitrary combination thereof.

In an embodiment, the first layer 300 may be disposed on the capping layer 230, where the first layer 300 includes metal or metal oxide. Because the capping layer 230 may be disposed on the organic light-emitting diode OLED, it may be understood that the first layer 300 including metal or metal oxide is disposed on the organic light-emitting diode OLED. In another embodiment, the display apparatus 1 may not include the capping layer 230, and the first layer 300 including metal or metal oxide is disposed on the organic light-emitting diode OLED. The first layer 300 including metal or metal oxide may include an inorganic material having low reflectivity. In an embodiment, the first layer 300 may include metal or metal oxide. In the case where the first layer 300 including metal or metal oxide includes metal, the first layer 300 including metal or metal oxide may include at least one of ytterbium (Yb), bismuth (Bi), tin (Sn), zinc (Zn), and phosphorus (In). In the case where the first layer 300 including metal or metal oxide includes metal oxide, the first layer 300 including metal or metal oxide may include at least one of molybdenum dioxide ($MoO_2$), molybdenum trioxide ($MoO_3$), tungsten trioxide ($WO_3$), ITO indium tin oxide (ITO), and zinc oxide (ZnO).

In an embodiment, the light absorption coefficient k of an inorganic material included in the first layer 300 including metal or metal oxide may be equal to or greater than about 4.0 and equal to or less than about 0.5 ($0.5<k\leq4.0$). In addition, the refractive index n of an inorganic material included in the first layer 300 including metal or metal oxide may be equal to or greater than about 1 ($n\geq1.0$).

The first layer 300 including metal or metal oxide may induce destructive interference between light incident to the inside of the display apparatus 1 and light reflected by metal disposed under the first layer 300 including metal or metal oxide, thereby reducing external light reflection. Accordingly, because external light reflection of the display apparatus 1 is reduced through the first layer 300 including metal or metal oxide, display quality and visibility of the display apparatus 1 may be effectively improved.

Although FIG. 5 shows a structure in which the first layer 300 including metal or metal oxide is disposed on the first substrate 100 entirely like the opposite electrode 223 and the capping layer 230, the embodiment is not limited thereto. In another embodiment, for example, the first layer 300 including metal or metal oxide may be patterned for each pixel.

In an embodiment, the filling layer 800 may be disposed on the first layer 300 including metal or metal oxide. The filling layer 800 may reduce interfacial reflection due to a reduction in the refractive index difference. The filling layer 800 may include an organic material. In an embodiment, for example, the filling layer 800 may include resin such as acryl, epoxy, or silicon-based material. In an embodiment, at least a portion of a reflection-adjusting layer 630 may be in direct contact with the filling layer 800. A surface of the light-blocking layer 610 adjacent to the first substrate 100 may be in direct contact with the filling layer 800. The filling layer 800 may fill the opening 610OP of the light-blocking layer 610. The light-blocking layer 610 may fill an opening passing through a first sub-light-blocking layer 611 (see FIG. 7), a second sub-light-blocking layer 612 (see FIG. 7), a first inorganic layer 613 (see FIG. 7), and a second inorganic layer 614 (see FIG. 7), and in other words, the filling layer 800 may fill an opening passing through the first sub-light-blocking layer 611, the second sub-light-blocking layer 612, the first inorganic layer 613, and the second inorganic layer 614.

The anti-reflection layer 600 may be disposed on the filling layer 800. The anti-reflection layer 600 may include the reflection-adjusting layer 630 and the light-blocking layer 610. The light-blocking layer 610 may be disposed to overlap the first layer 300 including metal or metal oxide in a plan view. Although not shown, the light-blocking layer 610 may include the first sub-light-blocking layer 611, the second sub-light-blocking layer 612, the first inorganic layer 613, and the second inorganic layer 614. The first inorganic layer 613 may be disposed to be in contact with the upper surface of the first sub-light-blocking layer 611. The second sub-light-blocking layer 612 may be disposed to be in contact with the upper surface of the first inorganic layer 613. In addition, the second inorganic layer 614 may be disposed to be in contact with the upper surface of the second sub-light-blocking layer 612. The light-blocking layer 610 may define the opening 610OP therein overlapping the emission area EA in a plan view. In other words, the first sub-light-blocking layer 611, the second sub-light-blocking layer 612, the first inorganic layer 613, and the second inorganic layer 614 may define the opening 610OP therein overlapping the emission area EA in a plan view. The light-blocking layer 610 may define the opening 610OP therein passing through the first sub-light-blocking layer 611, the second sub-light-blocking layer 612, the first inorganic layer 613, and the second inorganic layer 614.

The width of the opening 610OP of the light-blocking layer 610 may be greater than the width of the opening of the pixel-defining layer 209 defining the emission area EA in a plan view. In other words, the width of the opening 610OP passing through the first sub-light-blocking layer 611, the second sub-light-blocking layer 612, the first inorganic layer 613, and the second inorganic layer 614 may be greater than the width of the opening of the pixel-defining layer 209 defining the emission area EA. However, the embodiment is not limited thereto. In another embodiment, for example, the width of the opening 610OP of the light-blocking layer 610 may be equal to or less than the width of the opening of the pixel-defining layer 209 defining the emission area EA in a plan view. In other words, the width of the opening 610OP passing through the first sub-light-blocking layer 611, the second sub-light-blocking layer 612, the first inorganic layer 613, and the second inorganic layer 614 may be equal to or less than the width of the opening of the pixel-defining layer 209 defining the emission area EA.

A body portion of the light-blocking layer 610 outside the opening 610OP may overlap a non-emission area NEA in a plan view. The body portion of the light-blocking layer 610 denotes a portion having a preset volume in which the first sub-light-blocking layer 611, the second sub-light-blocking layer 612, the first inorganic layer 613, and the second inorganic layer 614 overlap each other in a plan view. Light emitted from the organic light-emitting diode OLED and external light incident from the outside of the display apparatus 1 may be at least partially reflected or cancelled in the body portion of the light-blocking layer 610.

In an embodiment, the reflection-adjusting layer 630 may be disposed on the light-blocking layer 610. The reflection-adjusting layer 630 may be disposed to be in contact with the upper surface of the light-blocking layer 610. The reflection-adjusting layer 630 may be configured to selectively absorb light in a portion of a wavelength band among light reflected by the inside of the display apparatus 1 or external light incident from the outside of the display apparatus 1.

Figure 6:
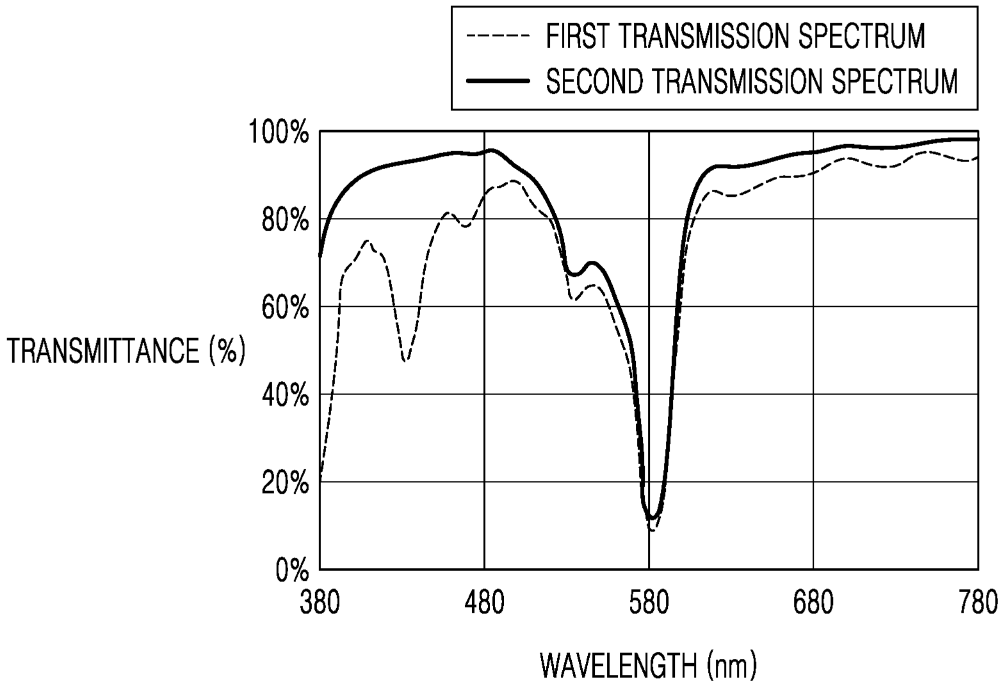
FIG. 6 is a graph showing a transmission spectrum of a reflection-adjusting layer according to an embodiment.

FIG. 6 is a graph showing a transmission spectrum of a reflection-adjusting layer according to an embodiment.

Referring to FIGS. 5 and 6, the reflection-adjusting layer 630 may have a first transmission spectrum or a second transmission spectrum. In an embodiment, in the case where the reflection-adjusting layer 630 has the first transmission spectrum, the reflection-adjusting layer 630 may be configured to absorb light in a first wavelength band of about 585 nm to about 605 nm. In this case, the transmission spectrum of the reflection-adjusting layer 630 may be provided such that the light transmittance in the first wavelength band is equal to or less than about 40%. In another embodiment, in the case where the reflection-adjusting layer 630 has the second transmission spectrum, the reflection-adjusting layer 630 may be configured to absorb light in the first wavelength band of about 585 nm to about 605 nm and light in a second wavelength band of about 420 nm to about 445 nm. In this case, the second transmission spectrum of the reflection-adjusting layer 630 may be provided such that the light transmittance in the first wavelength band is equal to or less than about 40% and the light transmittance in the second wavelength band is equal to or less than about 70%. That is, the reflection-adjusting layer 630 may be configured to absorb light of a wavelength deviating from the wavelength range of red, green, or blue light emitted from the respective display elements. As described above, because the reflection-adjusting layer 630 is configured to absorb light of a wavelength not in the wavelength range of red, green, or blue light of the organic light-emitting diode OLED, a decrease in the brightness of the display apparatus 1 may be prevented or reduced, simultaneously, a decrease in the light-emission efficiency of the display apparatus 1 may be prevented or reduced, and visibility of the display apparatus 1 may be effectively improved.

In another embodiment, the reflection-adjusting layer 630 may be configured to must absorb the second wavelength band of about 585 nm to about 605 nm and selectively absorb the first wavelength band of about 480 nm to about 500 nm. In an embodiment, for example, the reflection-adjusting layer 630 may be configured not to absorb the first wavelength band. Depending on the case, the reflection-adjusting layer 630 may be configured to absorb at least a portion of the first wavelength band to adjust the final reflection visible sense. Alternatively, the reflection-adjusting layer 630 may be configured to selectively absorb another wavelength band (e.g., about 410 nm to about 440 nm).

In an embodiment, the reflection-adjusting layer 630 may include an organic material layer including dye, pigment, or a combination thereof. The reflection-adjusting layer 630 may include a tetra aza porphyrin ("TAP")-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diammonium-based compound, a dipyrromethene-based compound, a cyanine-based compound, or a combination thereof.

In an embodiment, for example, the reflection-adjusting layer 630 may include a compound represented by one of Chemical Formulas 1 to 4 below. Chemical Formulas 1 to 4 may be chromophore structures corresponding to some of the compounds described above. Chemical Formulas 1 to 4 are only examples and the embodiment is not limited thereto:

<Chemical Formula 1>

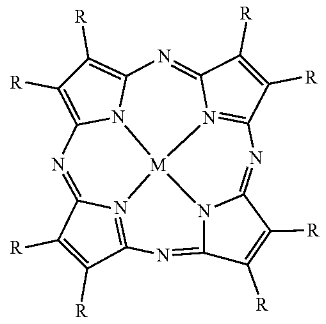

<Chemical Formula 2>

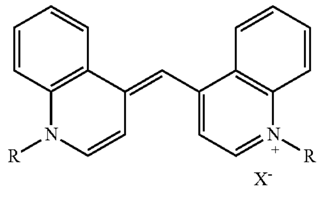

<Chemical Formula 3>

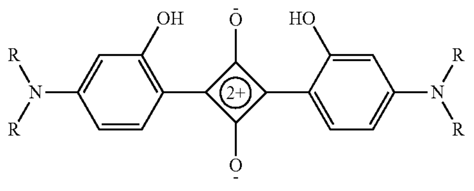

-continued

<Chemical Formula 4>

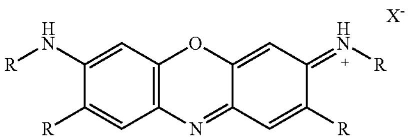

In Chemical Formulas 1 to 4,

M denotes metal,

X— denotes a monovalent anion,

Rs are the same as or different from each other, and each represents hydrogen, heavy hydrogen (-D), —F, —Cl, —Br, —I, a hydroxyl group, a cyano group, or a nitro group; heavy hydrogen, —F, —Cl, —Br, —I, a hydroxyl group, cyano group, a nitro group, a C3-C60 carbocyclic group, a C1-C60 heterocyclic group, a C6-C60 aryloxy group, a C6-C60 arylthio group, a C1-C60 alkyl group unsubstituted or substituted with —Si(Q11)(Q12)(Q13), —N(Q11)(Q12), —B(Q11)(Q12), —C(═O)(Q11), —S(═O)2(Q11), —P(═O)(Q11)(Q12), a C2-C60 alkenyl group, or any combination thereof, a C2-C60 alkynyl group, or C1-C60 alkoxy group; heavy hydrogen, —F, —Cl, —Br, —I, a hydroxyl group, a cyano group, a nitro group, a C1-C60 alkyl group, a C2-C60 alkenyl group, a C2-C60 alkynyl group, a C1-C60 alkoxy group, a C3-C60 carbocyclic group, a C1-C60 heterocyclic group, a C6-C60 aryloxy group, a C6-C60 arylthio group, a C3-C60 carbocyclic group unsubstituted or substituted with —Si(Q21)(Q22)(Q23), —N(Q21)(Q22), —B(Q21)(Q22), —C(═O)(Q21), —S(═O)2(Q21), —P(═O)(Q21)(Q22), or any combination thereof, a C3-C60 carbocyclic group, a C1-C60 heterocyclic group, a C6-C60 aryloxy group, or a C6-C60 arylthio group; or —Si(Q31)(Q32)(Q33), —N(Q31)(Q32), —B(Q31)(Q32), —C(═O)(Q31), —S(═O)2(Q31), or —P(═O)(Q31)(Q32).

Q1 to Q3, Q11 to Q13, Q21 to Q23, and Q31 to Q33 may each be independently hydrogen; heavy hydrogen; —F; —Cl; —Br; —I; a hydroxyl group; a cyano group; nitro group; a C1-C60 alkyl group; a C2-C60 alkenyl group; a C2-C60 alkynyl group; a C1-C60 alkoxy group; or a C3-C60 carbocyclic group or a C1-C60 heterocyclic group unsubstituted or substituted with heavy hydrogen, —F, a cyano group, a C1-C60 alkyl group, a C1-C60 alkoxy group, a phenyl group, a biphenyl group, or any combination thereof.

In an embodiment, X— may be a halide ion, a carbonylate ion, a nitrate ion, a sulfonate ion, or a bisulfate ion.

In an embodiment, for example, X— may be F—, Cl—, Br—, I—, $CH_3COO$—, $NO_3$—, $HSO_4$—, a propionate ion, a benzene sulfonate ion, or the like.

To reduce external light reflection, the display apparatus 1 according to an embodiment does not use a polarizing film but includes the first layer 300 including metal or metal oxide and the reflection-adjusting layer 630 instead.

In an embodiment, the second substrate 700 may be disposed on the reflection-adjusting layer 630. Specifically, the second substrate 700 may be disposed over the first substrate 100 with the display layer 200 therebetween. The anti-reflection layer 600 may be disposed on the lower surface of the second substrate 700 facing the first substrate 100. Here, when the anti-reflection layer 600 is disposed on the lower surface of the second substrate 700, it may mean that the anti-reflection layer 600 is directly formed on the lower surface of the second substrate 700, and then the first substrate 100 is bonded to the second substrate 700 such that the anti-reflection layer 600 is disposed between the first substrate 100 and the second substrate 700.

The light-blocking layer 610 may be directly disposed on the lower surface of the second substrate 700. In an embodiment, for example, the second inorganic layer 614 may be disposed on the lower surface of the second substrate 700, the second sub-light-blocking layer 612 may be disposed on the lower surface of the second inorganic layer 614 in a direction from the second inorganic layer 614 to the first substrate 100, the first inorganic layer 613 may be disposed on the lower surface of the second sub-light-blocking layer 612 in a direction from the second sub-light-blocking layer 612 to the first substrate 100, and the first sub-light-blocking layer 611 may be disposed on the lower surface of the first inorganic layer 613 in a direction from the first inorganic layer 613 to the first substrate 100. However, the embodiment is not limited thereto.

For the display apparatus 1 to reduce the reflectivity of the external light, the reflection-adjusting layer 630 may be disposed on the light-blocking layer 610. Specifically, the reflection-adjusting layer 630 may be disposed to be in contact with the upper surface of the light-blocking layer 610. When the reflection-adjusting layer 630 is disposed to be in contact with the upper surface of the light-blocking layer 610, the thickness of the display apparatus 1 may increase. In other words, because the thickness of the display apparatus 1 increases by the sum of the thickness of the light-blocking layer 610 and the thickness of the reflection-adjusting layer 630, the physical volume of the display apparatus 1 may increase. Due to the increase in the physical volume of the display apparatus 1 according to the increase in the thickness of the display apparatus 1, a non-bonding defect of the sealing member 900 (see FIG. 3) disposed between the first substrate 100 and the second substrate 700 of the display apparatus 1 may occur.

To reduce the non-bonding defect of the sealing member 900 disposed between the first substrate 100 and the second substrate 700 of the display apparatus 1, the thickness of the light-blocking layer 610 may be reduced. In an embodiment, the thickness of the light-blocking layer 610 may be equal to or greater than about 100 nm and equal to or less than about 500 nm. In the same structure in which the reflection-adjusting layer 630 is disposed to be in contact with the upper surface of the light-blocking layer 610 with the thickness of the light-blocking layer 610 reduced to equal to or greater than about 100 nm and equal to or less than about 500 nm, the thickness of the display apparatus 1 may be reduced by about 1.2 micrometers (μm) in the display area compared to a conventional display device.

Figure 7:
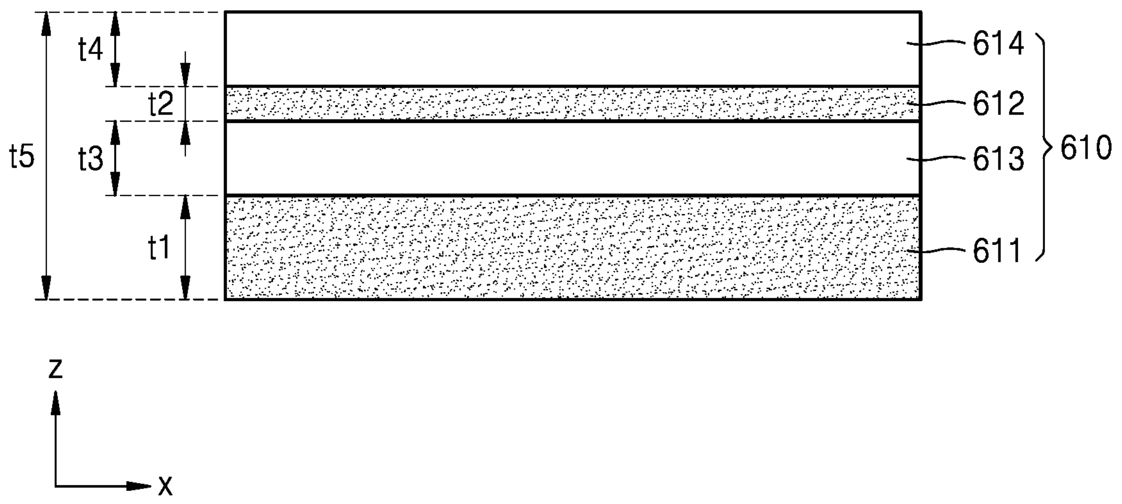
FIG. 7 is a schematic enlarged cross-sectional view of a light-blocking layer of FIG. 5.
Figure 9:
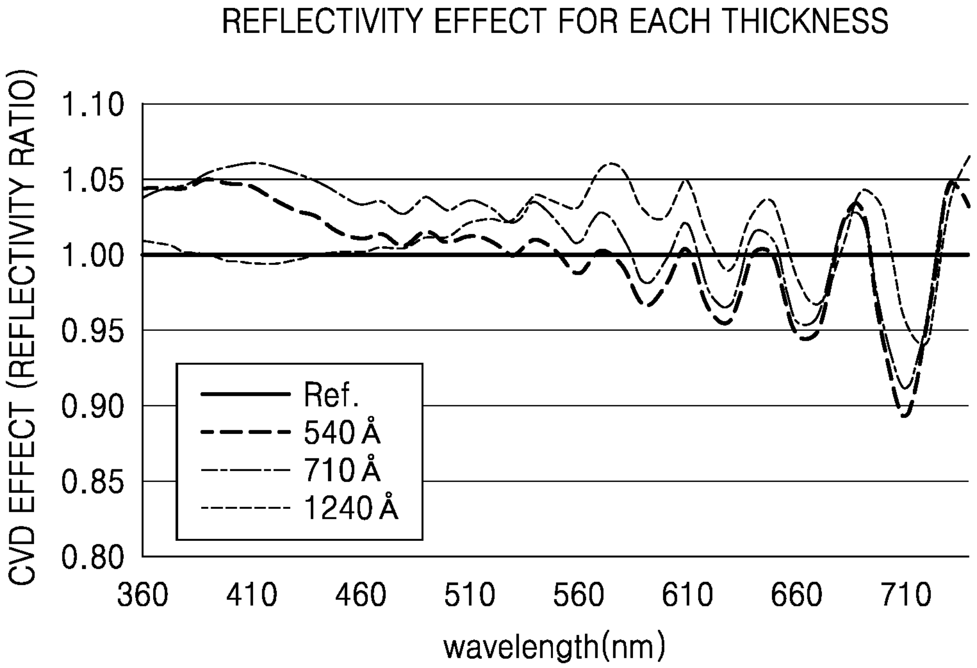
FIG. 9 is a schematic graph showing a reflectivity ratio according to a wavelength band of incident light to a display apparatus for each thickness of a second inorganic layer in the case where the second inorganic layer includes silicon nitride ($SiN_x$).

FIG. 7 is a schematic enlarged cross-sectional view of the light-blocking layer 610 of FIG. 5. FIGS. 8A to 8C are schematic views showing a reflectivity ratio of incident light to the display apparatus 1 for each thickness according to a material of the second inorganic layer 614. FIG. 9 is a schematic graph showing a reflectivity ratio according to a wavelength band of incident light to the display apparatus 1 for each thickness of the second inorganic layer 614 in the case where the second inorganic layer 614 includes silicon nitride ($SiN_x$). Here, a reflectivity ratio of incident light to the display apparatus 1 represents a reflectivity ratio of incident light compared to a reflectivity ratio of incident light in the case where the second inorganic layer 614 is not present. Hereinafter, a reflectivity ratio of incident light to the display apparatus 1 represents a reflectivity ratio of incident light compared to a reflectivity ratio of incident light in the case where the second inorganic layer 614 is not present.

Referring to FIG. 7, for the display apparatus 1 to reduce reflectivity of external light with the thickness of the light-blocking layer 610 reduced, the light-blocking layer 610 may have a multi-layered structure. Specifically, for the display apparatus 1 to reduce reflectivity of external light, the light-blocking layer 610 may have a multi-layered structure including both a layer including an inorganic material and a layer including metal.

The light-blocking layer 610 may include the first sub-light-blocking layer 611, the second sub-light-blocking layer 612, the first inorganic layer 613, and the second inorganic layer 614. The structure of the light-blocking layer 610 is specifically described, in which the first inorganic layer 613 may be disposed to be in contact with the upper surface of the first sub-light-blocking layer 611, the second sub-light-blocking layer 612 may be disposed to be in contact with the upper surface of the first inorganic layer 613, and the second inorganic layer 614 may be disposed to be in contact with the upper surface of the second sub-light-blocking layer 612.

The first sub-light-blocking layer 611 and the second sub-light-blocking layer 612 may include metal. Specifically, each of the first sub-light-blocking layer 611 and the second sub-light-blocking layer 612 may include at least one of tungsten (W), molybdenum (Mo), and chromium (Cr).

In an embodiment, the first sub-light-blocking layer 611 may have a first thickness t1 in a direction (e.g., a z direction) perpendicular to the upper surface of the first substrate 100. The second sub-light-blocking layer 612 may have a second thickness t2 in a direction (e.g., a z direction) perpendicular to the upper surface of the first substrate 100. The first thickness t1 of the first sub-light-blocking layer 611 may be greater than the second thickness t2 of the second sub-light-blocking layer 612. The second sub-light-blocking layer 612 may be disposed on the first sub-light-blocking layer 611. In other words, the first sub-light-blocking layer 611 may be disposed more adjacent to the first substrate 100 than the second sub-light-blocking layer 612. The first sub-light-blocking layer 611 may disposed under the second sub-light-blocking layer 612, the first inorganic layer 613, and the second inorganic layer 614. The first sub-light-blocking layer 611 may be configured to absorb leakage light among light incident from the outside or light reflected by each interface. Because the first thickness t1 of the first sub-light-blocking layer 611 is greater than the second thickness t2 of the second sub-light-blocking layer 612 to absorb at least a portion of incident light or reflected light, the external light reflectivity of the display apparatus 1 may be reduced.

Specifically, the first thickness t1 of the first sub-light-blocking layer 611 may be equal to or greater than 100 nm and equal to or less than 200 nm. The second thickness t2 of the second sub-light-blocking layer 612 may be equal to or greater than 8 nm and equal to or less than 11 nm. External light incident in a direction (e.g., a −z direction) from the second substrate 700 to the first substrate 100 may be reflected by the first sub-light-blocking layer 611 and the second sub-light-blocking layer 612. Portions of light reflected by the upper surface of each of the first sub-light-blocking layer 611 and the second sub-light-blocking layer 612 may be cancelled by interference. Accordingly, a wavelength band cancelled may be adjusted by adjusting each of the first thickness t1 of the first sub-light-blocking layer 611 and the second thickness t2 of the second sub-light-blocking layer 612. When the second thickness t2 of the second sub-light-blocking layer 612 is equal to or greater than 8 nm and equal to or less than 11 nm and the first thickness t1 of the first sub-light-blocking layer 611 is equal to or greater than 100 nm and equal to or less than 200 nm, pieces of light reflected by the first sub-light-blocking layer 611 and the second sub-light-blocking layer 612 are cancelled by each other, and thus, reflectivity of external light incident to the display apparatus 1 may be reduced. When the second thickness t2 of the second sub-light-blocking layer 612 is less than 8 nm or exceeds 11 nm, pieces of light reflected by the first sub-light-blocking layer 611 and the second sub-light-blocking layer 612 are not cancelled by each other, and thus, reflectivity of external light incident to the display apparatus 1 may increase.

A refractive index of a material of the second inorganic layer 614 may be equal to or greater than about 1.45 and equal to or less than about 1.65. The second inorganic layer 614 may be disposed on the first inorganic layer 613. The first inorganic layer 613 may be disposed between the first sub-light-blocking layer 611 and the second sub-light-blocking layer 612. The second inorganic layer 614 may be disposed on the first inorganic layer 613 to be in contact with the upper surface of the second sub-light-blocking layer 612. Because the second inorganic layer 614 is disposed in the uppermost portion of the light-blocking layer 610, the second inorganic layer 614 and the reflection-adjusting layer 630 on the light-blocking layer 610 may be disposed to be contact with each other. The reflection-adjusting layer 630 may be disposed to be in contact with the upper surface of the second inorganic layer 614. To reduce reflectivity of incident light from the outside at the interface where the reflection-adjusting layer 630 meets the second inorganic layer 614, the refractive index of the second inorganic layer 614 may be the same as or similar to the refractive index of the reflection-adjusting layer 630. To reduce reflectivity of incident light according to a refractive index at the interface where the reflection-adjusting layer 630 is in contact with the second inorganic layer 614, the refractive index of the second inorganic layer 614 may be the same as or similar to the refractive index of the reflection-adjusting layer 630. A refractive index of a material of the reflection-adjusting layer 630 may be equal to or greater than about 1.45 and equal to or less than about 1.65. Specifically, the refractive index of a material of the reflection-adjusting layer 630 may be about 1.5. To reduce reflectivity of incident light at the interface between the reflection-adjusting layer 630 and the second inorganic layer 614 in the display apparatus 1, the refractive indexes of the reflection-adjusting layer 630 and the second inorganic layer 614 may be the same or similar to each other, and the refractive index of the second inorganic layer 614 may be equal to or greater than about 1.45 and equal to or less than about 1.65. The refractive index of the first inorganic layer 613 may be equal to or greater than about 1.45 and equal to or less than about 1.65 which is the same as the refractive index of the second inorganic layer 614. However, the embodiment is not limited thereto. In another embodiment, the refractive index of the first inorganic layer 613 may be different from the refractive index of the second inorganic layer 614.

For the second inorganic layer 614 to have a refractive index of equal to or greater than about 1.45 and equal to or less than about 1.65, the second inorganic layer 614 may include at least one of silicon nitride ($SiN_x$), silicon oxynitride (SiON), and silicon oxide ($SiO_x$). Specifically, in the case where the second inorganic layer 614 includes silicon nitride ($SiN_x$), the refractive index of the second inorganic layer 614 may be about 1.63. In the case where the second inorganic layer 614 includes silicon oxynitride (SiON), the refractive index of the second inorganic layer 614 may be about 1.59. In the case where the second inorganic layer 614 includes silicon oxide ($SiO_2$), the refractive index of the second inorganic layer 614 may be about 1.47. The first inorganic layer 613 and the second inorganic layer 614 may include the same material. Like the second inorganic layer 614, the first inorganic layer 613 may include at least one of silicon nitride ($SiN_x$), silicon oxynitride (SiON), and silicon oxide ($SiO_x$). However, the embodiment is not limited thereto. In another embodiment, the first inorganic layer 613 may include a material different from a material of the second inorganic layer 614.

The first inorganic layer 613 may have a third thickness t3 in a direction perpendicular to the upper surface of the first substrate 100. The second inorganic layer 614 may have a fourth thickness t4 in a direction perpendicular to the upper surface of the first substrate 100. The third thickness t3 of the first inorganic layer 613 and the fourth thickness t4 of the second inorganic layer 614 may be the same. However, the embodiment is not limited thereto. In another embodiment, the third thickness t3 of the first inorganic layer 613 and the fourth thickness t4 of the second inorganic layer 614 may be different from each other.

Referring to FIGS. 7 and 8A, in the case where the second inorganic layer 614 includes silicon nitride ($SiN_x$), when the fourth thickness t4 of the second inorganic layer 614 is about 530 angstroms (Å), a reflectivity ratio may be about −0.04%, which is the highest. When the fourth thickness t4 of the second inorganic layer 614 is about 710 Å, a reflectivity ratio may be about +0.06%, and when the fourth thickness t4 of the second inorganic layer 614 is about 1240 Å, a reflectivity ratio may be about +0.15%.

Referring to FIGS. 7 and 9, FIG. 9 schematically shows a reflectivity ratio according to a wavelength of incident light to the display apparatus 1 for each fourth thickness t4 of the second inorganic layer 614 in the case where the second inorganic layer 614 incudes silicon nitride ($SiN_x$). Specifically, FIG. 9 schematically shows reflectivity ratios according to a wavelength of incident light to the display apparatus 1 when the fourth thickness t4 of the second inorganic layer 614 is about 540 Å, about 710 Å, and about 1240 Å, respectively, in the case where the second inorganic layer 614 incudes silicon nitride ($SiN_x$). When the fourth thickness t4 of the second inorganic layer 614 is about 540 Å, a reflectivity ratio of incident light to the display apparatus 1 may be the lowest in a wavelength band of 510 nm or more.

Based on the experimental results of FIGS. 8A and 9, in the case where the second inorganic layer 614 includes silicon nitride ($SiN_x$), the fourth thickness t4 of the second inorganic layer 614 may be equal to or greater than about 500 Å and equal to or less than about 600 Å. In other words, in the case where the second inorganic layer 614 includes silicon nitride ($SiN_x$), the fourth thickness t4 of the second inorganic layer 614 may be equal to or greater than about 50 nm and equal to or less than about 60 nm.

Referring to FIG. 8B, in the case where the second inorganic layer 614 includes silicon oxynitride (SiON), when the fourth thickness t4 of the second inorganic layer 614 is about 300 Å, a reflectivity ratio of incident light to the display apparatus 1 may be about −0.42%, and when the fourth thickness t4 of the second inorganic layer 614 is about 500 Å, a reflectivity ratio of incident light to the display apparatus 1 may be about −0.39%. In the case where the second inorganic layer 614 includes silicon oxynitride (SiON), when the fourth thickness t4 of the second inorganic layer 614 is about 100 Å, a reflectivity ratio of incident light to the display apparatus 1 may be about −0.18%, and when the fourth thickness t4 of the second inorganic layer 614 is about 700 Å, a reflectivity ratio of incident light to the display apparatus 1 may be about −0.13%. As a result, when the fourth thickness t4 of the second inorganic layer 614 is about 300 Å to about 500 Å, a reflectivity ratio of incident light to the display apparatus 1 may be significantly low compared to the case where the fourth thickness t4 of the second inorganic layer 614 is about 100 Å or about 700 Å. Based on the experimental results of FIG. 8B, in the case where the second inorganic layer 614 includes silicon oxynitride (SiON), the fourth thickness t4 of the second inorganic layer 614 may be equal to or greater than about 300 Å and equal to or less than about 500 Å. In other words, in the case where the second inorganic layer 614 includes silicon oxynitride (SiON), the fourth thickness t4 of the second inorganic layer 614 may be equal to or greater than about 30 nm and equal to or less than about 50 nm.

Referring to FIG. 8C, in the case where the second inorganic layer 614 includes silicon oxide ($SiO_x$), when the fourth thickness t4 of the second inorganic layer 614 is about 1500 Å, a reflectivity ratio of incident light to the display apparatus 1 may be about −0.3%, and when the fourth thickness t4 of the second inorganic layer 614 is about 1700 Å, a reflectivity ratio of incident light to the display apparatus 1 may be about −0.44%. When the fourth thickness t4 of the second inorganic layer 614 is about 1900 Å, a reflectivity ratio of incident light to the display apparatus 1 may be about −0.06%, and when the fourth thickness t4 of the second inorganic layer 614 is about 2100 Å, a reflectivity ratio of incident light to the display apparatus 1 may be about +0.28%. As a result, for a reflectivity ratio of incident light to the display apparatus 1 to be the lowest, when the fourth thickness t4 of the second inorganic layer 614 is about 1500 Å to 1700 Å, a reflectivity ratio of incident light to the display apparatus 1 may be significantly low compared to the case where the fourth thickness t4 of the second inorganic layer 614 is about 1900 Å or about 2100 Å. Based on the experimental results of FIG. 8C, for a reflectivity ratio of incident light to the display apparatus 1 to be the lowest, in the case where the second inorganic layer 614 includes silicon oxide ($SiO_x$), the fourth thickness t4 of the second inorganic layer 614 may be equal to or greater than about 1500 Å and equal to or less than about 1700 Å. In other words, in the case where the second inorganic layer 614 includes silicon oxide ($SiO_x$), the fourth thickness t4 of the second inorganic layer 614 may be equal to or greater than about 150 nm and equal to or less than about 170 nm.

In the related art, for the display apparatus to reduce reflectivity of external light, a reflection-adjusting layer may be disposed to be in contact with the upper surface of a light-blocking layer. When the reflection-adjusting layer is disposed to be in contact with the upper surface of the light-blocking layer, the thickness of the display apparatus increases, and thus, the physical volume of the display apparatus increases. Due to an increase in the physical volume of the display apparatus, a non-bonding defect of a sealing member disposed between a first substrate and a second substrate of the display apparatus occurs.

To reduce the non-bonding defect of the sealing member 900 disposed between the first substrate 100 and the second substrate 700 of the display apparatus 1, the thickness of the light-blocking layer 610 may be equal to or greater than about 100 nm and equal to or less than about 500 nm. To reduce the thickness of the light-blocking layer 610 of the display apparatus 1 and simultaneously reduce reflectivity of external light in the display apparatus 1, the light-blocking layer 610 may have a multi-layered structure including a layer including metal and a layer including an inorganic material. The light-blocking layer 610 may include the first sub-light-blocking layer 611 and the second sub-light-blocking layer 612, which include metal, and the first inorganic layer 613 and the second inorganic layer 614, which include an inorganic material. The first inorganic layer 613 may be disposed to be in contact with the upper surface of the first sub-light-blocking layer 611. The second sub-light-blocking layer 612 may be disposed to be in contact with the upper surface of the first inorganic layer 613. The second inorganic layer 614 may be disposed to be in contact with the upper surface of the second sub-light-blocking layer 612. The first thickness t1 of the first sub-light-blocking layer 611 may be greater than the second thickness t2 of the second sub-light-blocking layer 612. The second thickness t2 of the second sub-light-blocking layer 612 may be equal to or greater than 8 nm and equal to or less than 11 nm, and the first thickness t1 of the first sub-light-blocking layer 611 may be equal to or greater than about 100 nm and equal to or less than about 150 nm.

According to an embodiment having the above configuration, the display apparatus with improved visibility may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a first substrate;

a display element disposed over the first substrate and configured to implement an emission area;

a first layer including a metal or a metal oxide disposed on the first substrate separate from the display element;

a light-blocking layer overlapping the first layer and not overlapping the emission area in a thickness direction of the display apparatus and including a first sub-light-blocking layer, a first inorganic layer, a second sub-light-blocking layer, and a second inorganic layer, wherein the first inorganic layer is disposed on the first sub-light-blocking layer, the second sub-light-blocking layer is disposed on the first inorganic layer, and the second inorganic layer is disposed on the second sub-light-blocking layer; and a reflection-adjusting layer disposed on the light-blocking layer, wherein a thickness of the light-blocking layer is equal to or greater than about 100 nanometers (nm) and equal to or less than about 500 nm.

2. The display apparatus of claim 1, wherein the reflection-adjusting layer is in contact with an upper surface of the light-blocking layer.

3. The display apparatus of claim 1, wherein the light-blocking layer defines an opening therein passing through the first sub-light-blocking layer, the first inorganic layer, the second sub-light-blocking layer, and the second inorganic layer, wherein the opening corresponds to the emission area in a plan view.

4. The display apparatus of claim 1, further comprising a filling layer disposed on the first layer.

5. The display apparatus of claim 4, wherein the filling layer fills an opening passing through the first sub-light-blocking layer, the first inorganic layer, the second sub-light-blocking layer, and the second inorganic layer.

6. The display apparatus of claim 1, wherein a thickness of the first sub-light-blocking layer is equal to or greater than 100 nm and equal to or less than 200 nm.

7. The display apparatus of claim 1, wherein a thickness of the second sub-light-blocking layer is equal to or greater than 8 nm and equal to or less than 11 nm.

8. The display apparatus of claim 1, wherein each of the first sub-light-blocking layer and the second sub-light-blocking layer includes metal.

9. The display apparatus of claim 8, wherein each of the first sub-light-blocking layer and the second sub-light-blocking layer includes at least one of tungsten (W), molybdenum (Mo), and chromium (Cr).

10. The display apparatus of claim 1, wherein a refractive index of each of the first inorganic layer and the second inorganic layer is equal to or greater than about 1.45 and equal to or less than about 1.65.

11. The display apparatus of claim 1, wherein each of the first inorganic layer and the second inorganic layer includes at least one of silicon nitride ($SiN_x$), silicon oxynitride (SiON), and silicon oxide ($SiO_x$).

12. The display apparatus of claim 1, wherein the second inorganic layer includes silicon nitride ($SiN_x$), and a thickness of the second inorganic layer is equal to or greater than about 50 nm and equal to or less than about 60 nm.

13. The display apparatus of claim 1, wherein the second inorganic layer includes silicon oxynitride (SiON), and a thickness of the second inorganic layer is equal to or greater than about 30 nm and equal to or less than about 50 nm.

14. The display apparatus of claim 1, wherein the second inorganic layer includes silicon oxide ($SiO_x$), and a thickness of the second inorganic layer is equal to or greater than about 150 nm and equal to or less than about 170 nm.

15. The display apparatus of claim 1, wherein a thickness of the first inorganic layer is the same as a thickness of the second inorganic layer.

16. The display apparatus of claim 1, further comprising a second substrate disposed on the reflection-adjusting layer.

17. The display apparatus of claim 16, further comprising a sealing member disposed between the first substrate and the second substrate along an outer circumference of the first substrate and the second substrate in a plan view.

18. The display apparatus of claim 1, wherein the reflection-adjusting layer includes dye, pigment, or a combination thereof.

19. The display apparatus of claim 1, wherein the first layer includes at least one of ytterbium (Yb), bismuth (Bi), tin (Sn), zinc (Zn), indium (In), molybdenum dioxide ($MoO_2$), molybdenum trioxide ($MoO_3$), tungsten trioxide ($WO_3$), indium tin oxide (ITO), and zinc oxide (ZnO).

20. A display apparatus comprising:

a first substrate;

a display element disposed over the first substrate and configured to implement an emission area;

a first layer including a metal or a metal oxide disposed on the first substrate;

a light-blocking layer overlapping the first layer and including a first sub-light-blocking layer, a first inorganic layer, a second sub-light-blocking layer, and a second inorganic layer, wherein the first inorganic layer is disposed on the first sub-light-blocking layer, the second sub-light-blocking layer is disposed on the first inorganic layer, and the second inorganic layer is disposed on the second sub-light-blocking layer; and a reflection-adjusting layer disposed on the light-blocking layer, wherein a thickness of the light-blocking layer is equal to or greater than about 100 nanometers (nm) and equal to or less than about 500 nm wherein a thickness of the first sub-light-blocking layer is greater than a thickness of the second sub-light-blocking layer.

* * * * *